United States Patent
Juengling

(12) 
(10) Patent No.: US 6,787,465 B2
(45) Date of Patent: Sep. 7, 2004

(54) METHOD OF FORMING A METAL TO POLYSILICON CONTACT IN OXYGEN ENVIRONMENT

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/274,156

(22) Filed: Oct. 21, 2002

(65) Prior Publication Data

US 2003/0057467 A1 Mar. 27, 2003

Related U.S. Application Data

(60) Continuation of application No. 09/930,268, filed on Aug. 16, 2001, now Pat. No. 6,472,322, which is a division of application No. 09/650,071, filed on Aug. 29, 2000, now Pat. No. 6,583,460.

(51) Int. Cl.[7] .............................................. H01L 21/44
(52) U.S. Cl. ....................................... 438/684; 438/672
(58) Field of Search ................................ 438/311, 626, 438/672, 675, 680, 683, 684, 685, 686

(56) References Cited

U.S. PATENT DOCUMENTS

| | | |
|---|---|---|
| 4,394,406 A | 7/1983 | Gardiner et al. |
| 4,960,732 A | 10/1990 | Dixit et al. |
| 4,976,839 A * | 12/1990 | Inoue .................... 204/192.17 |
| 5,354,705 A | 10/1994 | Mathews et al. |
| 5,756,396 A | 5/1998 | Lee et al. |
| 5,770,520 A | 6/1998 | Zhao et al. |
| 5,834,369 A | 11/1998 | Murakami et al. |
| 6,090,658 A | 7/2000 | Joo |
| 6,136,655 A | 10/2000 | Assaderaghi et al. |
| 6,274,388 B1 | 8/2001 | Aggarwal et al. |
| 6,277,728 B1 | 8/2001 | Ahn et al. |
| 6,472,322 B2 * | 10/2002 | Juengling .................. 438/684 |
| 6,583,460 B1 * | 6/2003 | Juengling .................. 257/296 |

FOREIGN PATENT DOCUMENTS

EP   0 926 741 A2   12/1998

* cited by examiner

*Primary Examiner*—David Nhu
(74) *Attorney, Agent, or Firm*—Dickstein Shapiro Morin & Oshinsky LLP

(57) ABSTRACT

A method for forming a contact capable of tolerating an $O_2$ environment up to several hundred degrees Celsius for several hours is disclosed. To slow down the metal oxide front of the metal layer at the metal-polysilicon interface, the metal layer is surrounded by one or more oxygen sink spacers and layers. These oxygen sink spacers and layers are oxidized before the metal layer at the bottom of the plug is oxidized. Accordingly, the conductive connection between the polysilicon and any device built on top of the barrier layer is preserved.

26 Claims, 12 Drawing Sheets

METHOD OF FORMING A METAL TO POLYSILICON CONTACT IN OXYGEN ENVIRONMENT

This application is a continuation application of U.S. patent application Ser. No. 09/930,268, filed Aug. 16, 2001, now U.S. Pat. No. 6,472,326 which in turn is a divisional application of U.S. patent application Ser. No. 09/650,071, filed Aug. 29, 2000 now U.S. Pat. No. 6,583,460 the entirety of both being incorporated by reference herein.

FIELD OF THE INVENTION

The present invention relates to the field of semiconductor integrated circuits and, in particular, to metal-polysilicon contacts capable of tolerating high temperature oxidizing environments.

BACKGROUND OF THE INVENTION

Semiconductor integrated circuits with high device density pose increasing difficulty to the formation of high-reliability electrical connections between metalization layers and semiconductor elements, particularly between the metal of a metallic electrode and the adjacent polysilicon of a polysilicon plug. This increased difficulty stems mainly from the tendency of metal and silicon to interdiffuse when in contact with each other, and when subjected to the high temperatures necessary during the fabrication of integrated circuits.

To illustrate the tendency of metal-silicon interdiffusion, the formation of a metallic contact between a polysilicon plug and a metallic electrode at a specified contact area will be briefly described bellow. FIG. 1 depicts a portion of a conventional memory cell construction for a DRAM at an intermediate stage of the fabrication, in which a metal-polysilicon contact is formed according to conventional processes.

A pair of memory cells having respective access transistors 33 are formed within a well 13 of a substrate 12. The wells and transistors are surrounded by a field oxide region 14 that provides isolation. N-type active regions 16 are provided in the doped p-type well 13 of substrate 12 (for NMOS transistors) and the pair of access transistors have respective gate stacks 30. The gate stacks 30 include an oxide layer 18, a conductive layer 20, such as poly silicon, nitride spacers 32, and a nitride cap 22. Additional stacks 31 may also be formed for use in performing self aligned contact etches to form conductive plugs for capacitor structures in the region between stacks 30,31. The details of these steps are well-known in the art and are not described in this application.

Next, a polysilicon plug 50 (FIG. 1) is formed in a contact opening of a first insulating layer 24, to directly connect to a source or drain region 16 of the semiconductor device. The first insulating layer 24 could be, for example, borophosphosilicate glass (BPSG), borosilicate glass (BSG), or phosphosilicate glass (PSG). Once the polysilicon plug 50 is formed, the whole structure, including the substrate 12 with the gate stacks 30, tie first insulating layer 24 and the polysilicon plug 50, is chemically or mechanically polished to provide a planarized surface.

At this point, a second insulating layer 25, which can be of the same material as that of the first insulating layer 24, is deposited over the first insulating layer 24 and the polysilicon plug 50. A contact opening or via is etched over the polysilicon plug 50 and a metal layer or metal electrode 55 is then deposited and patterned to connect to the polysilicon plug 50, as illustrated in FIG. 1. Thus, polysilicon plug 50 comes into contact with the metal layer or electrode 55 at a metal-polysilicon interface 51 (FIG. 1). It must be understood, however, that, as known in the art, any other conductor, such as a capacitor plate for example, may also be in contact with a polysilicon plug, and the discussion herein applies to any metal-polysilicon interface.

Since several steps during the IC fabrication require temperatures higher than 500° C., such as annealing steps, for example, silicon from the polysilicon plug 50 migrates into the metal film of the metallic electrode 55 during these high-temperature steps. Although this silicon migration into the metal film occurs in limited regions, near or at the metal-polysilicon interface 51, since the migrated silicon has high resistivity, the contact resistance at the metal-polysilicon interface 51 is greatly increased.

Barrier layers have been introduced to solve the silicon diffusion problem at the metal-polysilicon contact, such as interface 51 (FIG. 1). A barrier layer 52 is illustrated in FIG. 2 (which shows only a middle portion of the structure of FIG. 1). Conventionally, the barrier layer is a refractory metal compound such as refractory metal nitrides (for example TiN or HfN), refractory metal carbides (for example TiC or WC), or refractory metal borides (for example TiB or MoB). Barrier layers suppress the diffusion of the silicon and metal atoms at the polysilicon-metal interface, while offering a low resistivity and low contact resistance between the silicon and the barrier layer, and between the metal and the barrier layer. However, there is a problem with such barrier layers in that, in an $O_2$ high temperature environment, they oxidize and disconnect the metal layer from the polysilicon plug. The oxide of the barrier layer may be formed either between the metal and the barrier layer, or between the polysilicon and the barrier layer. The latter situation is illustrated in FIG. 3, which shows metal oxide layer 53 formed between barrier layer 52 and polysilicon plug 50. In either case, the oxide of the barrier layer affects the conductive properties of the metal contact by increasing the electric resistance in the electrical connection region.

In an effort to reduce the oxidation problems posed by barrier layers subjected to oxidizing environments, different techniques have been introduced into the IC fabrication. One of them is manipulating and controlling the deposition parameters of the barrier materials. For example, U.S. Pat. No. 4,976,839 discloses that the presence of an oxide at grain boundaries within a titanium nitride (TiN) barrier layer improves the ability of the barrier layer to prevent the diffusion of silicon and aluminum. The reference further discloses a method for forming a barrier layer having large grain sizes by increasing the substrate temperature during sputtering, so that the formation of the oxide at the grain boundaries may be accomplished with a relatively large amount of oxygen, but without degradation in the film conductivity.

Similarly, to further improve the characteristics of the barrier layers, certain metals, for which both the oxidized species (MeO) as well as the unoxidized species (Me) are electrically conducting, have been recently used as barrier layers between metal and polysilicon. Examples of these metals are ruthenium (Ru), platinum (Pt), or iridium (Ir), among others. Since these barrier layers are conductive in both the metal and the oxide forms, this approach is useful in that both the oxide and the metal forms slow down the oxidation front in an $O_2$ high temperature environment. However, this technique has a drawback in that there will still be some areas where the metal does not oxidize and, thus, the barrier layer would consist of portions of pure metal species and portions of metal oxide.

Accordingly, there is a need for an improved method for slowing down the oxidation front in barrier layers used in contacts between metal and polysilicon so that there is no oxidation at the polysilicon-metal interface. There is also a need for metal-polysilicon contacts that inhibit the diffusion of silicon and metal atoms at a contact interface and prevent the formation of oxides under high temperature $O_2$ environment, as well as a method of forming such metal-polysilicon contacts.

SUMMARY OF THE INVENTION

The present invention provides a method for forming a metal-polysilicon contact that would be capable of tolerating an $O_2$ environment up to several hundred degrees Celsius for several hours. To prevent a metal oxide front, which is formed during a high temperature $O_2$ treatment from reaching the metal film at the metal-polysilicon interface, the metal film is surrounded by a plurality of oxygen sinks. These oxygen sinks are oxidized before the metal film at the bottom of the plug is oxidized. Accordingly, the conductive connection between the polysilicon and any device built on top of the barrier layer is preserved.

Additional advantages of the present invention will be more apparent from the detailed description and accompanying drawings, which illustrate preferred embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The present invention provides a method for forming a metal oxide-metal-polysilicon contact capable of tolerating on oxygen environment up to several hundred degrees and for several hours. The invention provides one or more oxygen sink layers, which are oxidized before the metal film is oxidized at the metal-polysilicon interface. The oxygen sink layers slow down the oxidation front of the metal film, so it does not reach the metal-polysilicon interface.

Figure 4:
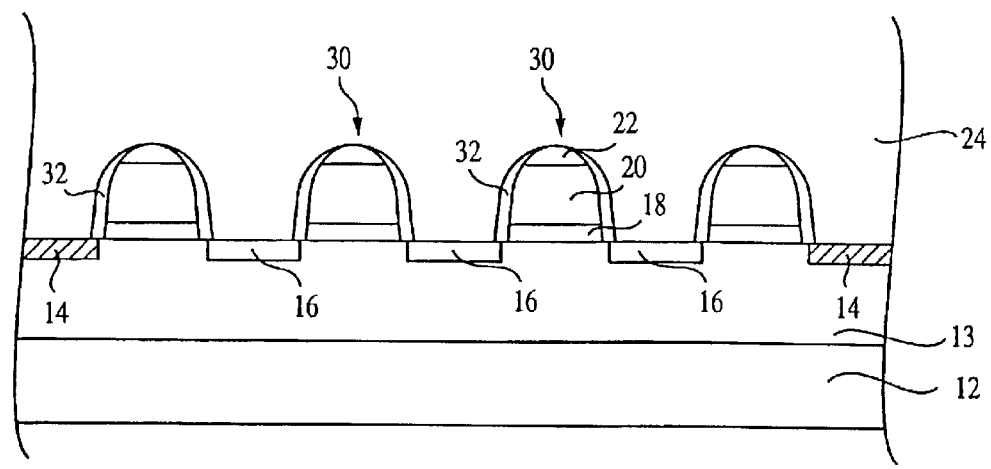
FIG. 4 is a schematic cross-sectional view of a portion of a memory DRAM device, in which a metal-polysilicon contact according to a first embodiment and method of the present invention will be formed.

FIG. 4 depicts a conventional memory cell construction for a DRAM at an intermediate stage of the fabrication, in which a pair of memory cells having respective access transistors are formed on a substrate 12. The FIG. 4 structure includes the substrate 12 having a well 13, which is typically doped to a predetermined conductivity, e.g. p-type or n-type depending on whether NMOS or PMOS transistors will be formed therein. The structure further includes field oxide regions 14, conventional doped active areas 16 for use as source/drain regions, and a pair of gate stacks 30, all formed according to well-known semiconductor processing techniques. The gate stacks 30 include an oxide layer 18, a conductive layer 20, such as polysilicon, nitride spacers 32 and a nitride cap 22.

Above the gate oxide region 18, the polysilicon gates 20, and the protective nitride regions 22,32, a first insulating layer 24 (FIG. 4) is disposed. Insulating layer 24 could be, for example, borophosphosilicate glass (BPSG), borosilicate glass (BSG), or phosphosilicate glass (PSG).

Figure 5:
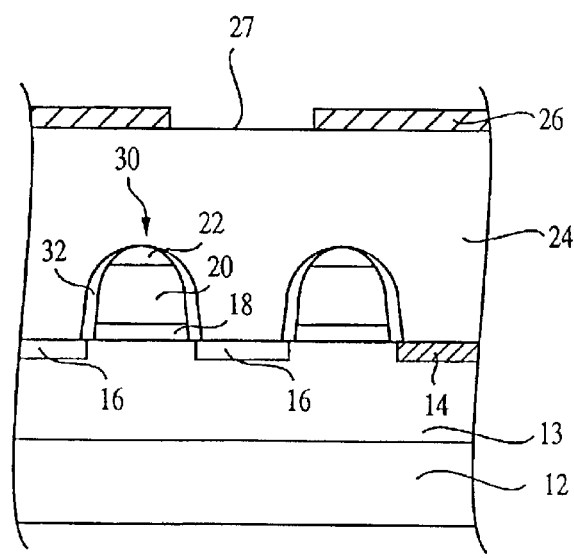
FIG. 5 is a schematic cross sectional view of the FIG. 4 device at a stage of processing subsequent to that shown in FIG. 4.
Figure 6:
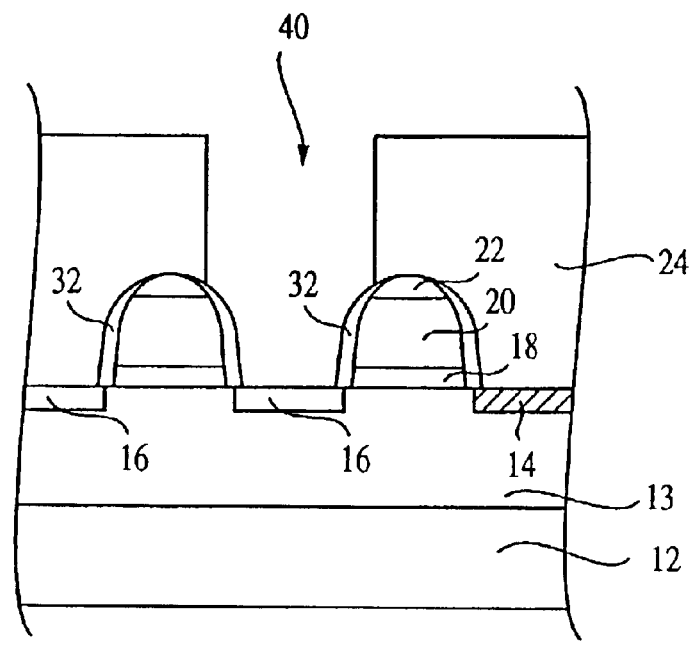
FIG. 6 is a schematic cross sectional view of the FIG. 5 device at a stage of processing subsequent to that shown in FIG. 5.

Reference is now made to FIG. 5, which for simplicity illustrates only a lateral portion, for example a right side portion, of FIG. 4. This is a region where a contact plug and an overlying capacitor structure will be formed. To create a contact opening 40 (FIG. 6) into semiconductor substrate 12 through the first insulating layer 24, a photoresist material 26 (FIG. 5) is deposited and patterned using conventional photolithography steps. After patterning, an initial opening 27 (FIG. 5) is present in photoresist layer 26 for subsequent oxide etching. The structure of FIG. 5 is then etched, to form a contact opening 40 through first insulating layer 24 and the photoresist layer is removed as shown in FIG. 6. The contact opening 40 is etched so that contact opening 40 extends to a source/drain region 16 provided in well 13 of substrate 12.

Figure 7:
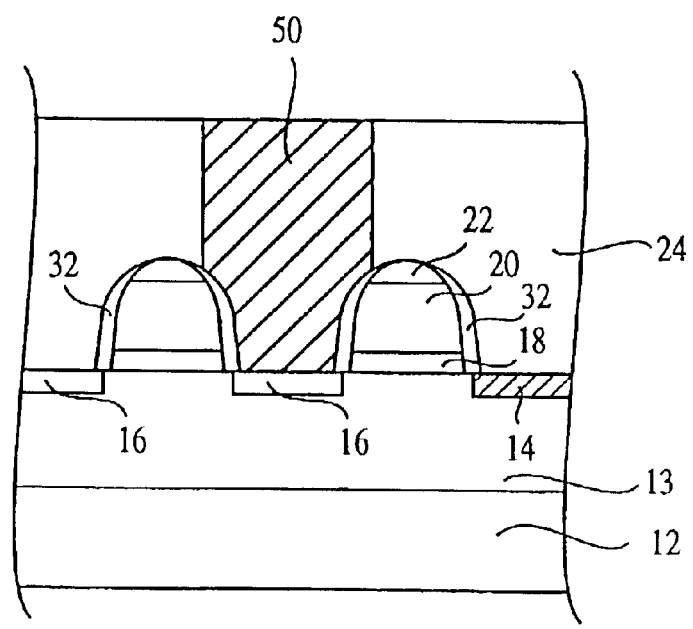
FIG. 7 is a schematic cross sectional view of the FIG. 6 device at a stage of processing subsequent to that shown in FIG. 6.
Figure 8:
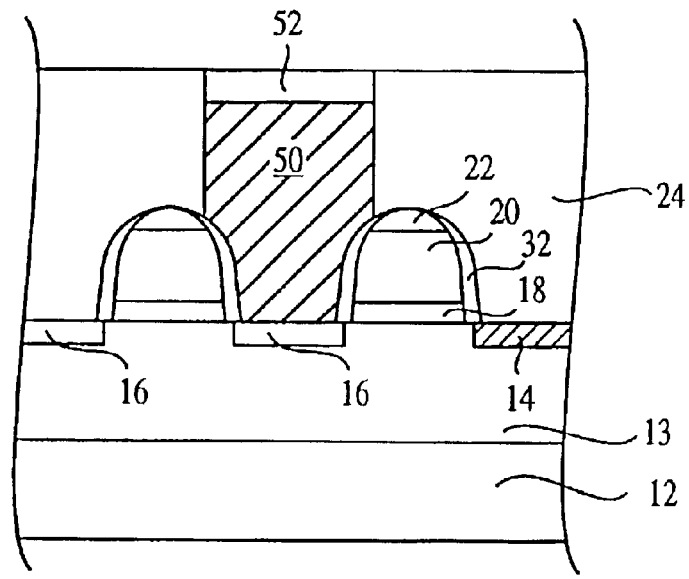
FIG. 8 is a schematic cross sectional view of the FIG. 7 device at a stage of processing subsequent to that shown in FIG. 7.

Next, contact opening 40 is filled with a conductive material, such as doped polysilicon, that is planarized down to or near the planar surface of the first insulating layer 24, to form a polysilicon plug or filler 50, as illustrated in FIG. 7. The polysilicon plug 50 is then anisotropically etched until its top surface is recessed below the planar surface of the first insulating layer 24, so that a barrier layer 52 (FIG. 8) can be deposited and planarized, as shown in FIG. 8. The barrier layer 52, preferably of titanium (Ti), is formed on the polysilicon plug 50 by CVD, PVD, sputtering or evaporation, to a thickness of about 60 to about 200 Angstroms. The titanium barrier layer 52 will form titanium silicide ($TiSi_2$) during a later high temperature anneal.

Figure 9:
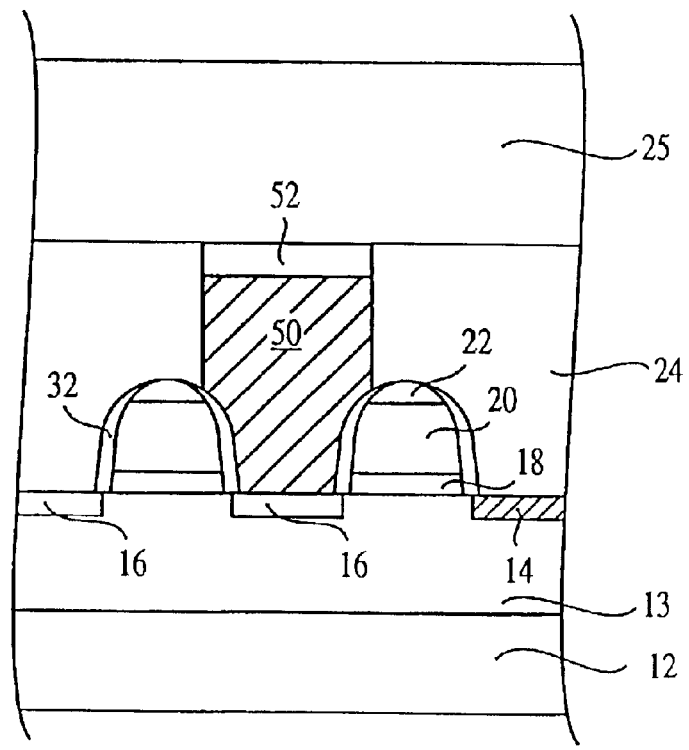
FIG. 9 is a schematic cross sectional view of the FIG. 8 device at a stage of processing subsequent to that shown in FIG. 8.

FIG. 9 illustrates the deposition of a second insulating layer 25, which could be, for example, a silicon oxide, borophosphosilicate glass (BPSG), borosilicate glass (BSG), phosphosilicate glass (PSG), or tetraethylortho silicate (TEOS). The second insulating layer 25 is deposited over the barrier layer 52 and the first insulating layer 24. Again, using the same fabrication technique as the one used for the formation of contact opening 40 (FIG. 6) through the first insulating layer 24, a contact opening 41 (FIG. 10) is formed through the second insulating layer 25.

Figure 10:
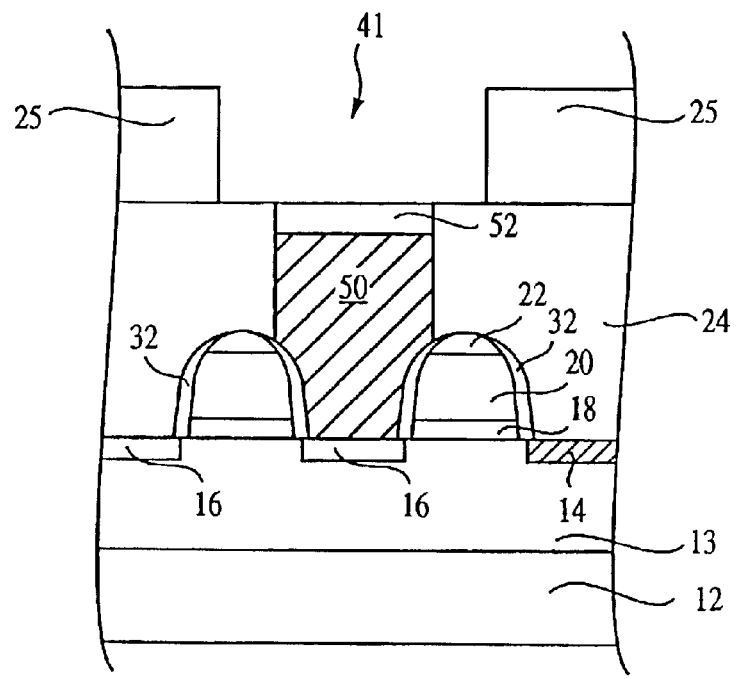
FIG. 10 is a schematic cross sectional view of the FIG. 9 device at a stage of processing subsequent to that shown in FIG. 9.
Figure 11:
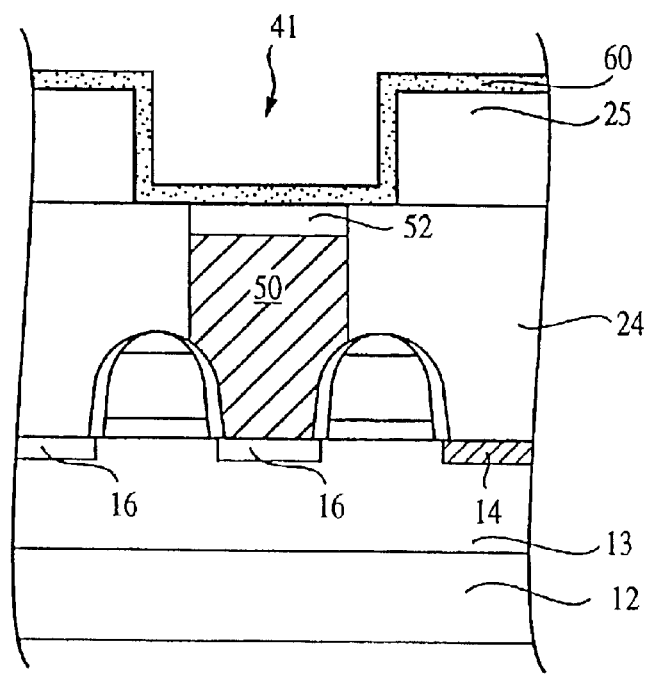
FIG. 11 is a schematic cross sectional view of the FIG. 10 device at a stage of processing subsequent to that shown in FIG. 10.
Figure 12:
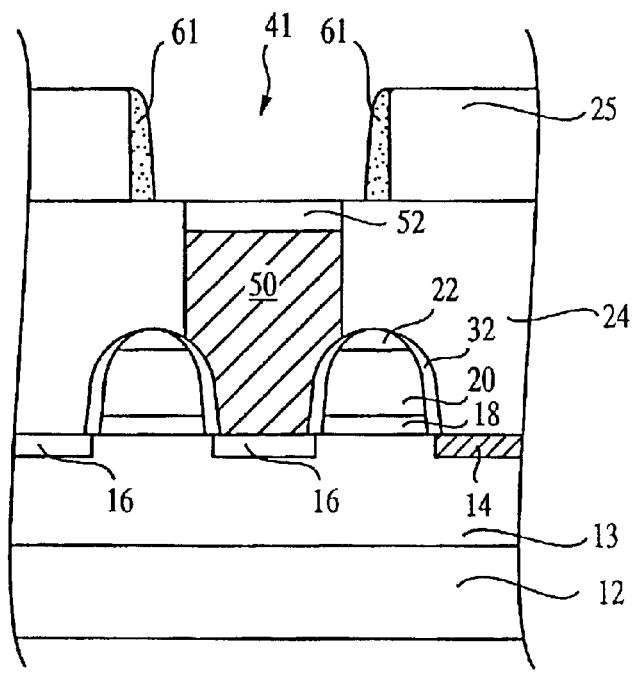
FIG. 12 is a schematic cross sectional view of the FIG. 11 device at a stage of processing subsequent to that shown in FIG. 11.

Subsequent to the formation of contact opening 41 of FIG. 10, a material acting as an oxygen sink is deposited by using plasma, reactive sputtering or a conventional chemical vapor deposition to form a first oxygen sink layer 60, as shown in FIG. 11, to a thickness of about 100 Angstroms. Preferred materials for the first oxygen sink layer 60 are polysilicon, aluminum nitride, titanium, titanium nitride, silicon nitride, or tantalum, among others. A characteristic of the sink material is that it oxidizes in a high temperature $O_2$ environment. Although some of the metals employed as oxygen sink oxidize and become therefore nonconductive, this fact raises no problems because, in the embodiments described below, these metals are used strictly as oxygen sinks and not as barrier layers. After deposition of the oxygen sink layer 60, a spacer etch is employed to remove respective portions of the first oxygen sink layer 60 inside the contact opening 41 and on the planar surface of the second insulating layer 25, leaving only spacers 61 formed of oxygen sink material on the side walls of contact opening 41, as illustrated in FIG. 12. The etch stops at the upper surface of the barrier layer 52, without damaging, or etching into, the upper surface of the barrier layer 52.

Figure 13:
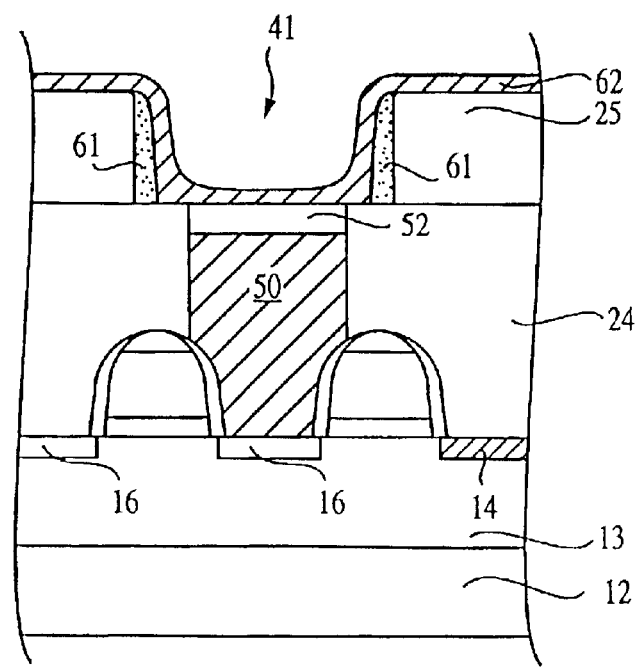
FIG. 13 is a schematic cross sectional view of the FIG. 12 device at a stage of processing subsequent to that shown in FIG. 12.

Next, referring to FIG. 13, a layer 62 of conductive metal is formed inside the contact opening 41, over the upper surface of the barrier layer 52, over the spacers 61 and over the upper surface of insulating layer 25. Although FIG. 13 illustrates the metal layer 62 as formed over the upper surface of the second insulating layer 25, it is to be understood that metal layer 62 does not have to cover the second insulating layer 25. Depending on the type of devices that would be further built to complete the formation of a DRAM memory cell, the metal layer 62 may or may not extend over the second insulating layer 25, as long as it is formed inside of the contact opening 41.

Preferred materials for the conductive material layer 62 are metal conductors which, when oxidized, are still conductive, such as platinum (Pt), ruthenium (Ru), iridium (Ir), rhodium (Rh) and their respective oxides, or any other metal capable of forming a metal-barrier layer-polysilicon contact on top of the polysilicon plug or filler 50. Metal layer 62 could be formed by any conventional method, such as deposition or sputtering, to a thickness of approximately 100 to 300 Angstroms.

Figure 14:
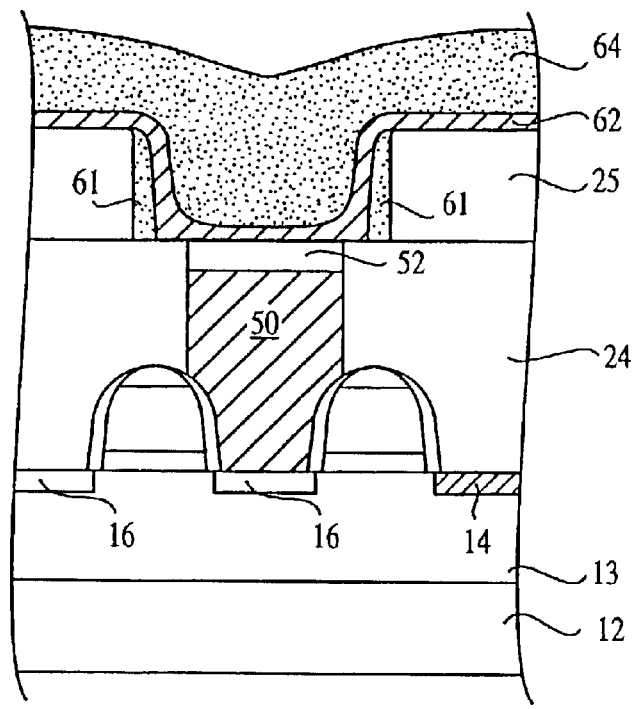
FIG. 14 is a schematic cross sectional view of the FIG. 13 device at a stage of processing subsequent to that shown in FIG. 13.
Figure 15:
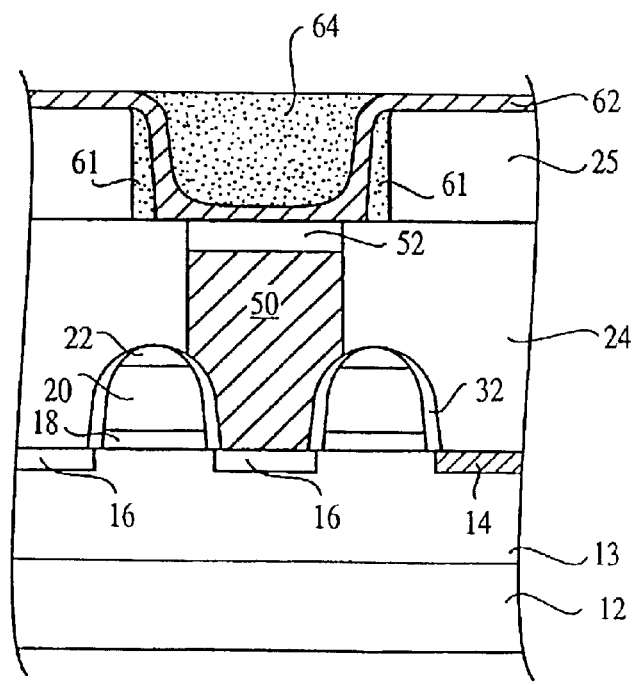
FIG. 15 is a schematic cross sectional view of the FIG. 14 device at a stage of processing subsequent to that shown in FIG. 14.

A second oxygen sink layer 64 is next formed over the metal or metal oxide layer 62. This is illustrated in FIG. 14. The material for this second oxygen sink layer 64 may be, for example, a material which oxidizes at high temperature $O_2$ environment, such as polysilicon, aluminum nitride, titanium nitride, silicon nitride, or tantalum. The second oxygen sink layer 64 is then chemically metal polished (CMP) to form oxygen sink layer 64 of FIG. 15, on top of which another device could now be built.

Figure 16:
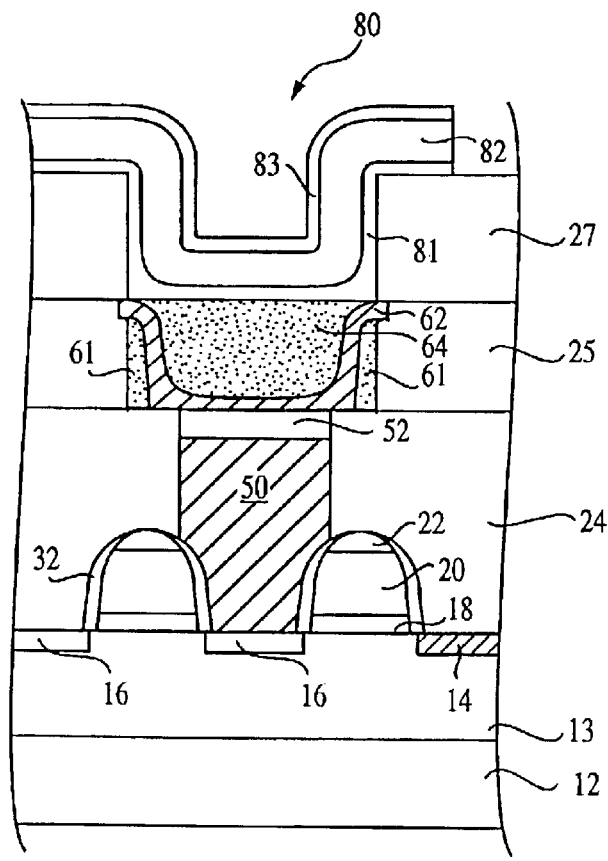
FIG. 16 is a schematic cross sectional view of the FIG. 15 device at a stage of processing subsequent to that shown in FIG. 15, and depicting a capacitor formed over the metal-polysilicon contact.
Figure 17:
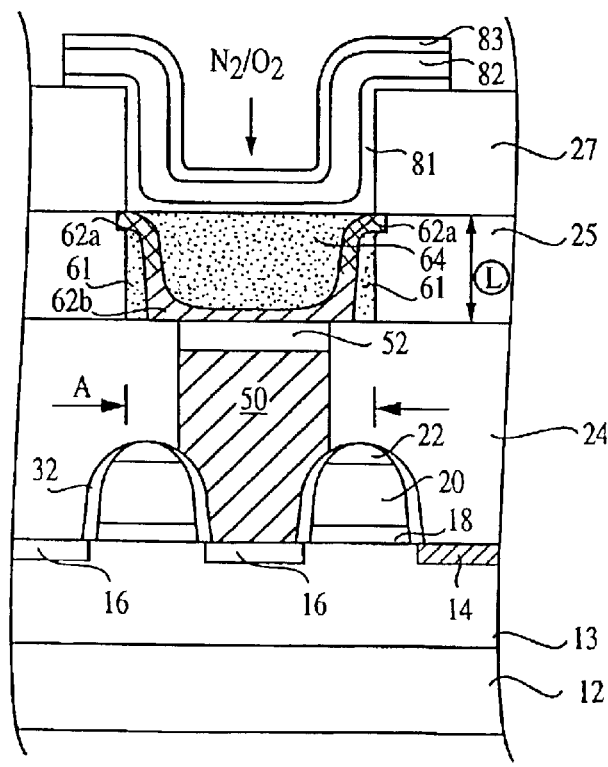
FIG. 17 is a schematic cross sectional view of the FIG. 16 device at a stage of processing subsequent to that shown in FIG. 16.

For example, as shown in FIG. 16, a capacitor 80 formed of a first ruthenium oxide conductor (RuOx) layer 81, a tantalum oxide dielectric (TaOx) layer 82, and a second ruthenium oxide conductor (RuOx) layer 83 can be formed in an opening created in a third insulating layer 27 provided over the second insulating layer 25, at a position on top of the upper surface of the oxygen sink layer 64. The RuOx layer 81 is fabricated to be in contact with metal (or metal oxide) layer 62. As known in the art, during the fabrication process of the capacitor 80, the first ruthenium oxide conductor 81 requires an $N_2/O_2$ anneal, in an oxygen environment at high temperatures. Thus, during the anneal step, an oxygen front will move through the first ruthenium oxide conductor 81, and move towards the oxygen sink layer 64, the metal layer 62 and the barrier layer 52, towards the polysilicon plug 50, as shown in FIG. 17. The oxygen front will be delayed by the oxygen sink layers 64 and 61, but will nevertheless start oxidizing the metal layer 62 from the top of the upper surface of the second insulating layer 25.

The oxygen sink layers 64 and 61 slow the movement of the oxygen front so that it never reaches barrier layer 52 during the $N_2/O_2$ anneal. This is shown in FIG. 17. The upper portion of the metal layer 62 may oxidize during the anneal process to form a conductive metal oxide layer 62a, but the remaining portion of the metal layer 62 is not oxidized during the anneal process as is shown by unoxidized metal layer 62b. Thus, an effective conductive path from capacitor conductor 81 to conductive plug 50, through metal oxide layer 62a, metal layer 62b, and barrier layer 52, is provided.

As a general proposition, it should be clear that the thicker the oxygen sink layer 64, the slower the advancement of the oxygen front towards the barrier layer 52 and the polysilicon plug 50. Similarly, the greater the number of oxygen sink layers, the slower the advancement of the oxygen front towards the barrier layer 52. Of course, as well-known in the art, the advancement of the oxygen front toward the polysilicon plug 50 is also slowed down by employing a high aspect ratio contact, that is, a contact with a small cross section A (FIG. 17) but a large height L (FIG. 17) of the spacers 61 formed of oxygen sink material. A high aspect ratio is, for example, an aspect ratio of 25. Thus, ideally, the oxygen front is delayed by employing a multi-layer oxygen sink in a high aspect ratio metal-polysilicon contact.

Figure 18:
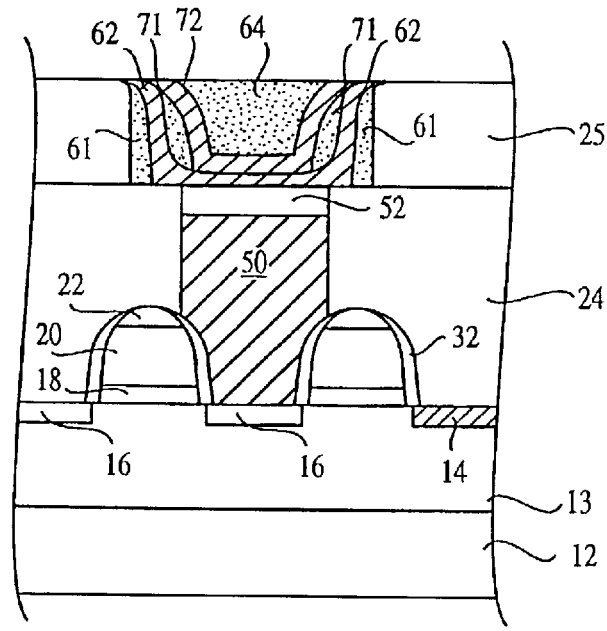
FIG. 18 is a schematic cross sectional view of the FIG. 14 device at a stage of processing subsequent to that shown in FIG. 14, and in accordance with a second embodiment of the present invention.

FIG. 18 shows a second embodiment of the invention, which uses a first and second oxygen sink spacers, 61 and 71, respectively, as well as a first and second metal layers, 62 and 72, respectively, formed before a first oxygen sink layer 64 is formed. Layers 62, 71, 72 and 64 are sequentially formed in a way similar to that employed for the formation of metal layer 62 (FIG. 13) and oxygen sink layer 64 (FIGS. 14–15), described with respect to the formation of the first embodiment of the present invention. As shown in FIG. 18, each of the layers 62, 71, 72 and 64 is chemical mechanical polished (CMP) so that each of their upper surfaces end at the upper surface of the second insulating layer 25, where a capacitor structure can be built in the manner shown and described with reference to FIGS. 16 and 17. Of course, as explained above, layers 62, 71, 72 and 64 could extend over and cover the upper surfaces of the second insulating layer 25, as long as the conductor 81 of a fabricated overlying capacitor can connect with conductive layers 62 and 72.

Figure 19:
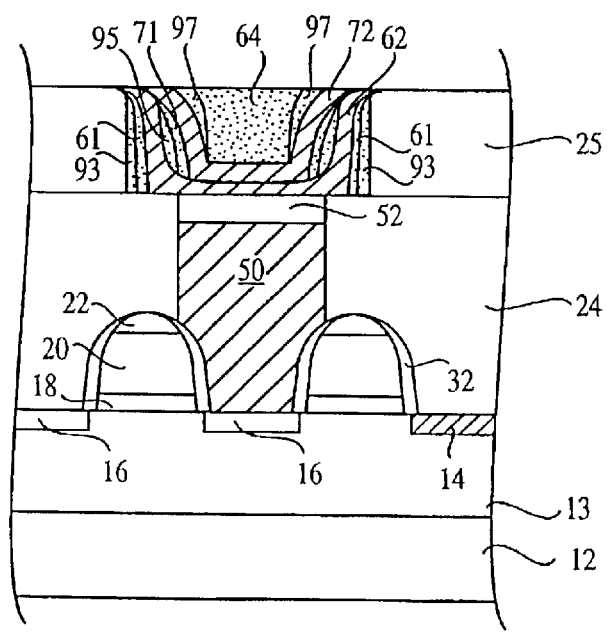
FIG. 19 is a schematic cross sectional view of the FIG. 14 device at a stage of processing subsequent to that shown in FIG. 14, and in accordance with a third embodiment of the present invention.

FIG. 19 illustrates yet a third embodiment of the present invention, which uses an oxygen sink layer that is not a good barrier to oxygen diffusion. An example of such oxygen sink material is titanium. In this embodiment, nitride layers 93, 95 and 97 formed of silicon nitride, for example, which is a good oxygen barrier, is used in connection with titanium oxygen sink spacers 61 and 71, and titanium layer 64. As explained above, the first and second oxygen sink spacers, 61 and 71, formed of titanium, as well as a first and second metal layers, 62 and 72, respectively, are formed before the titanium layer 64 is formed. Layers 93, 62, 95, 71, 72, 97 and 64 are sequentially formed in a way similar to that employed for the formation of metal layer 62 (FIG. 13) and oxygen sink layer 64 (FIGS. 14–15), described with respect to the formation of the first embodiment of the present invention. As shown in FIG. 19, when all of the layers 93, 62, 95, 71, 72, 97 and 64 are applied, the structure is chemical mechanical polished (CMP) so that each of their upper surfaces end at the upper surface of the second insulating layer 25, where a capacitor structure can be built.

Figure 1:
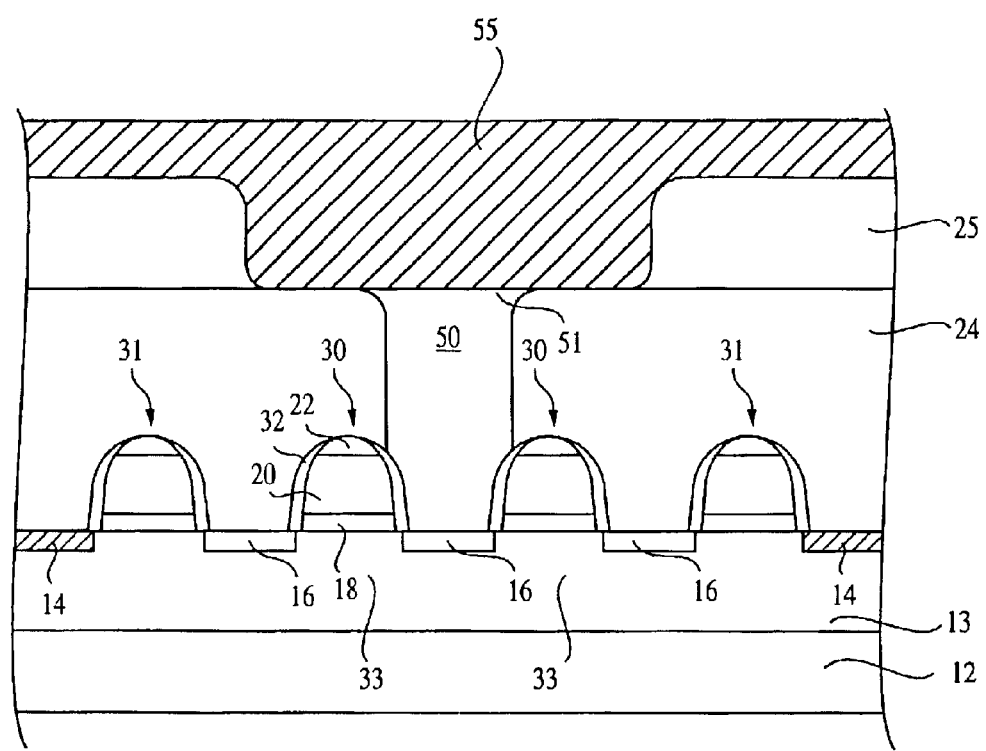
FIG. 1 is a schematic cross-sectional view of a portion of a conventional memory DRAM device illustrating a metal-polysilicon contact formed in accordance with a method of the prior art.
Figure 2:
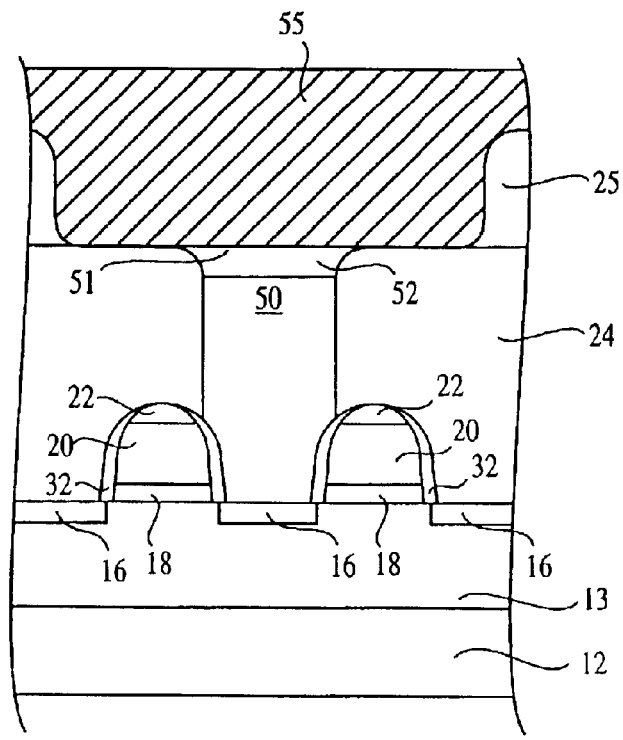
FIG. 2 is a schematic cross-sectional view of the FIG. 1 device illustrating use of a barrier layer in a metal-polysilicon contact formed in accordance with the prior art.
Figure 3:
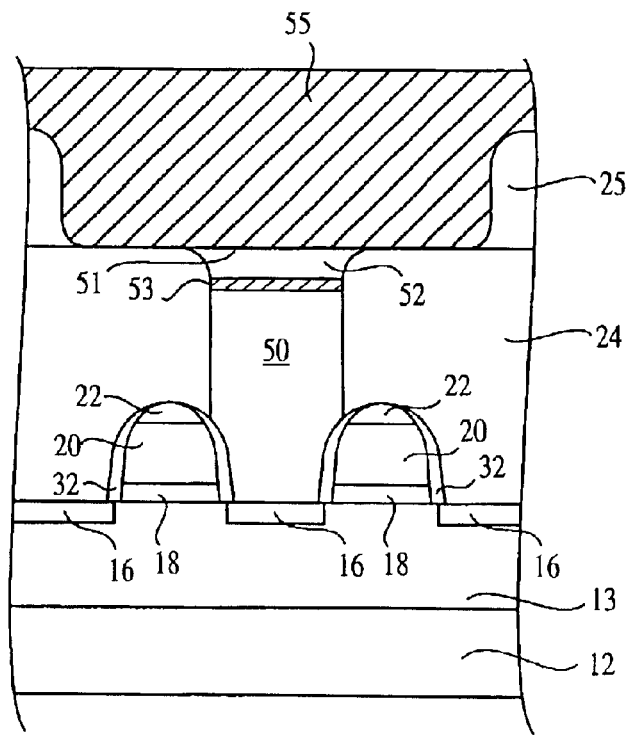
FIG. 3 is a schematic cross-sectional view of the FIG. 2 device depicting the formation of an oxide layer between a polysilicon plug and a barrier layer.
Figure 20:
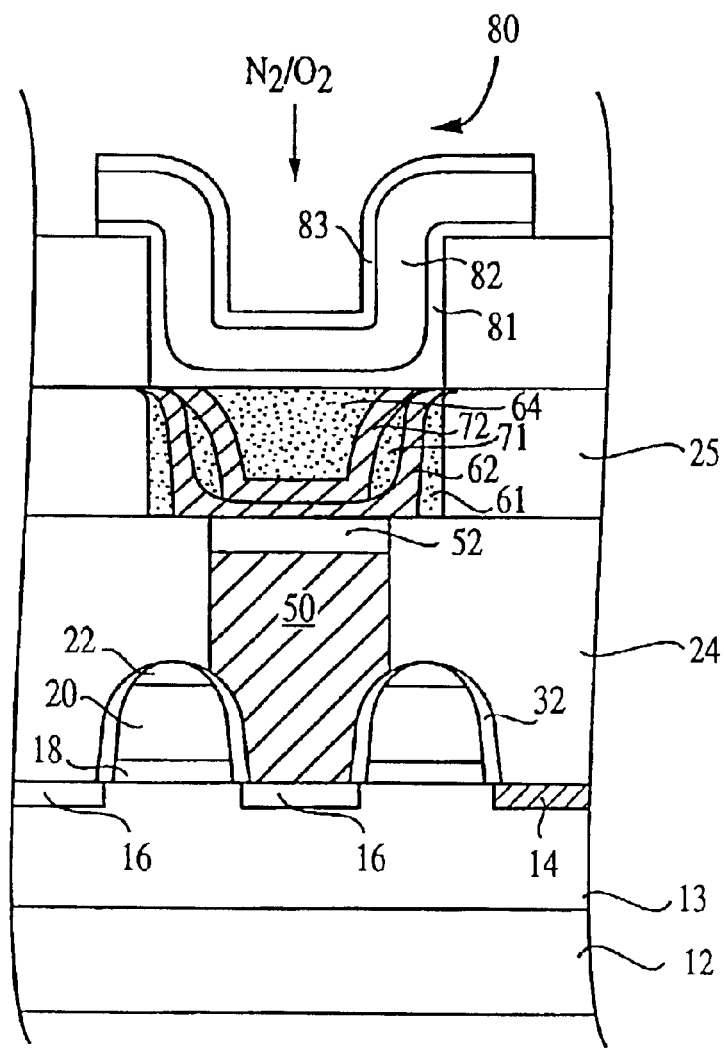
FIG. 20 is a schematic cross sectional view of the FIG. 18 device at a stage of processing subsequent to that shown in FIG. 18, and depicting a capacitor formed over the metal-polysilicon contact.

FIG. 20 shows a capacitor 80 formed on the FIG. 18 structure. The capacitor 80 includes a first ruthenium oxide conductor layer 81, a tantalum oxide dielectric layer 82, and a second ruthenium oxide conductor layer 83. The capacitor is formed so that conductor 81 is in contact with metal conductors 62 and 72. During the anneal step for the fabrication of the first ruthenium oxide conductor 81, the oxygen front will start from the first ruthenium oxide conductor 81 and move towards the polysilicon plug 50. The oxygen front is delayed by oxygen sink spacers 61, 71, and 64 and will not reach the bottom of the metal layer 62, which connects to the barrier layer 52, preventing therefore the formation of a barrier oxide layer, such as oxide layer 53 of FIG. 3. Further steps to create a functional memory cell containing the metal oxide-metal-polysilicon contact (FIGS. 15–20) may now be carried out to form other conductors or structures necessary for memory cell fabrication.

It should be noted again that the metal used for layers 62 and 72 must be one of those in which the metal oxide is conductive. Suitable materials include platinum, rhodium, ruthenium, and iridium, among others.

Figure 21:
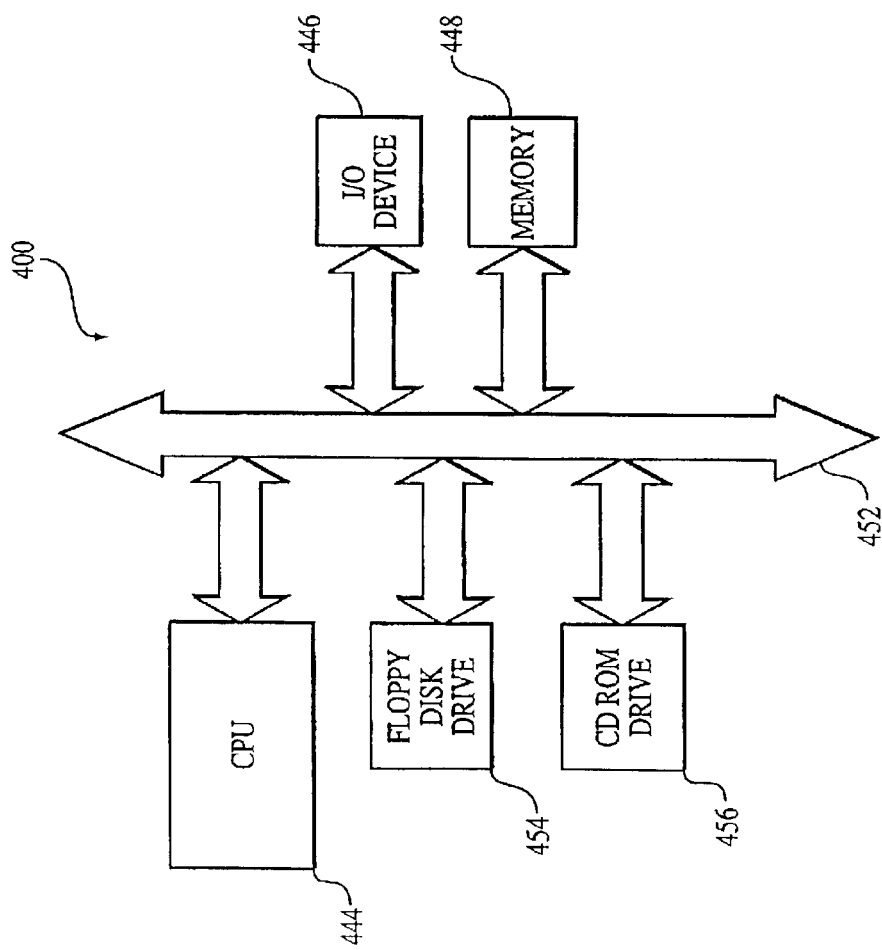
FIG. 21 is an illustration of a computer system having a memory device employing the present invention.

A typical processor based system 400 which includes a memory circuit 448, e.g. a DRAM, containing metal-polysilicon contacts according to the present invention is illustrated in FIG. 21. A processor system, such as a computer system, generally comprises a central processing unit (CPU) 444, such as a microprocessor, a digital signal processor, or other programmable digital logic device, which communicates with an input/output (I/O) device 446 over a bus 452. The memory 448 communicates with the central processing unit 444 over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes metal-polysilicon contacts formed as previously described with respect to the embodiments described in connection with FIGS. 4 to 20. The memory 448 may also be combined with the processor, e.g. CPU 444, on a single integrated circuit chip. It is also possible to employ the invention in metal-polysilicon contacts within said processor.

Although the exemplary embodiments described above refer to one or two oxygen sink spacers and oxygen sink layers, and one or two metal layers for the formation of the metal oxide-metal-polysilicon contact (FIGS. 15–20), it is to be understood that the present invention contemplates the use of a plurality of oxygen sink spacers, oxygen sink layers, and metal layers, and it is not limited by the illustrated embodiments. Accordingly, the above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for forming a metal-polysilicon contact in a semiconductor device, comprising the acts of:
    forming an insulating layer over a barrier layer residing over a polysilicon layer;
    forming a contact opening in said insulating layer;
    forming at least one conductive layer and at least one oxygen sink layer in said contact opening, said oxygen sink layer being capable of absorbing oxygen; and
    forming a semiconductor device over said at least one oxygen sink layer and said conductive layer.

2. The method of claim 1, wherein said semiconductor device is a capacitor formed in contact with said conductive layer.

3. The method of claim 2 further comprising the act of heat annealing said capacitor.

4. The method of claim 3, wherein said act of heat annealing said capacitor is conducted in an nitrogen/oxygen environment.

5. The method of claim 2, wherein said capacitor comprises a first capacitor electrode formed over said conductive layer, a dielectric layer formed over said first capacitor electrode, and a second capacitor electrode formed over said dielectric layer.

6. The method of claim 2, wherein said capacitor comprises a first ruthenium oxide electrode, a tantalum oxide dielectric layer, and a second ruthenium oxide electrode.

7. The method of claim 1, wherein said at least one oxygen sink layer is formed of a material selected from the group consisting of polysilicon, aluminum nitride, titanium nitride, tantalum, and silicon nitride.

8. The method of claim 3, wherein said at least one oxygen sink layer is formed of titanium.

9. A method for forming a metal-polysilicon contact in a semiconductor device, comprising the acts of:
   forming an insulating layer over a barrier layer residing over a polysilicon layer;
   forming a contact opening in said insulating layer;
   forming at least one conductive layer and at least one oxygen sink layer in said contact opening, said oxygen sink layer being capable of absorbing oxygen and being formed as a plurality of spaced oxygen sink layers; and
   forming a semiconductor device over said at least one oxygen sink layer and said conductive layer.

10. The method of claim 9, wherein said plurality of spaced oxygen sink layers comprises two oxygen sink layers separated by one conductive layer.

11. The method of claim 9, wherein said plurality of spaced oxygen sink layers comprises three oxygen sink layers separated by two contacting conductive layers.

12. A method for fabricating a metal-polysilicon contact in a semiconductor device, comprising the acts of:
   forming an insulating layer over a barrier layer residing over a polysilicon layer;
   forming a contact opening in said insulating layer;
   forming at least one conductive layer and at least one oxygen sink layer in said contact opening, said oxygen sink layer being capable of absorbing oxygen;
   forming a capacitive element over and in contact with said conductive layer; and
   subjecting said capacitive element to a nitrogen/oxygen anneal treatment.

13. The method of claim 12, wherein said capacitive element comprises a first ruthenium oxide electrode, a tantalum oxide dielectric layer, and a second ruthenium oxide electrode.

14. The method of claim 12, wherein said oxygen sink layer is formed of a material selected from the group consisting of polysilicon, aluminum nitride, titanium nitride, tantalum, and silicon nitride.

15. A method for fabricating a metal-polysilicon contact in a semiconductor device, comprising the acts of:
   forming an insulating layer over a barrier layer residing over a polysilicon layer;
   forming a contact opening in said insulating layer;
   forming at least one conductive layer and at least one oxygen sink layer in said contact opening, said oxygen sink layer being capable of absorbing oxygen and being formed as a plurality of spaced oxygen sink layers;
   forming a capacitive element over and in contact with said conductive layer; and
   subjecting said capacitive element to a nitrogen/oxygen anneal treatment.

16. The method of claim 15, wherein said plurality of spaced oxygen sink layers comprises two oxygen sink layers separated by one conductive layer.

17. The method of claim 25, wherein said plurality of spaced oxygen sink layers comprises three oxygen sink layers separated by two contacting conductive layers.

18. A method for fabricating a metal-polysilicon contact in a semiconductor device, comprising the steps of:
   forming an insulating layer over a barrier layer residing over a polysilicon layer;
   forming a contact opening in said insulating layer; and
   forming a first oxygen sink spacer in said contact opening, said first oxygen sink spacer being capable of absorbing oxygen;
   forming a first conductive layer in said contact opening and in contact with said first oxygen sink spacer;
   forming a second oxygen sink spacer in said contact opening and in contact with said first conductive layer, said second oxygen sink spacer being capable of absorbing oxygen;
   forming a second conductive layer in said contact opening and in contact with said second oxygen sink spacer, said second conductive layer being in contact with said first conductive layer;
   forming an oxygen sink layer in said contact opening and in contact with said second conductive layer; and
   forming a capacitor over said oxygen sink layer and said second conductive layer.

19. The method of claim 18, wherein said oxygen sink layer is formed of a material selected from the group consisting of polysilicon, aluminum nitride, titanium nitride, tantalum, and silicon nitride.

20. The method of claim 18, wherein each of said first and second oxygen sink spacers is formed of a material selected from the group consisting of polysilicon, aluminum nitride, titanium nitride, titanium, tantalum, and silicon nitride.

21. The method of claim 18, wherein said capacitor comprises a first ruthenium oxide electrode, a tantalum oxide dielectric layer, and a second ruthenium oxide electrode.

22. A method of forming a metal-polysilicon contact in a semiconductor device, comprising the steps of:
   forming an insulating layer over a barrier layer residing over a polysilicon layer;
   forming a contact opening in said insulating layer; and
   forming a first oxygen barrier layer in said contact opening;
   forming a first oxygen sink spacer in said contact opening and in contact with said first oxygen barrier layer, said first oxygen sink spacer being capable of absorbing oxygen;
   forming a first conductive layer in said contact opening and in contact with said first oxygen sink spacer;
   forming a second oxygen barrier layer in said contact opening and in contact with said first conductive layer;
   forming a second oxygen sink spacer in said contact opening and in contact with said second oxygen barrier layer, said second oxygen sink spacer being capable of absorbing oxygen;

forming a second conductive layer in said contact opening and in contact with said second oxygen sink spacer, said second conductive layer being in contact with said first conductive layer;

forming a third oxygen barrier layer in said contact opening and in contact with said second conductive layer;

forming an oxygen sink layer in said contact opening and in contact with said third oxygen barrier layer; and forming a capacitor over said oxygen sink layer and said second conductive layer.

23. The method of claim 22, wherein said oxygen sink layer is formed of a material selected from the group consisting of polysilicon, aluminum titanium nitride, tantalum, and silicon nitride.

24. The method of claim 22, wherein each of said first and second oxygen sink spacers is formed of a material selected from the group consisting of polysilicon, aluminum nitride, titanium nitride, titanium, tantalum, and silicon nitride.

25. The method of claim 22, wherein each of said first, second and third oxygen barrier layers is formed of silicon nitride.

26. The method of claim 22, wherein said capacitor comprises a first ruthenium oxide electrode, a tantalum oxide dielectric layer, and a second ruthenium oxide electrode.

* * * * *

UNITED STATES PATENT AND TRADEMARK OFFICE
CERTIFICATE OF CORRECTION

PATENT NO. : 6,787,465 B2
DATED : September 7, 2004
INVENTOR(S) : Werner Juengling It is certified that error appears in the above-identified patent and that said Letters Patent is hereby corrected as shown below:

Column 1,
Line 7, change "6,472,326" to -- 6,472,322 --; and
Line 59, change "tie" to -- the --.

Signed and Sealed this

Eleventh Day of January, 2005

JON W. DUDAS
*Director of the United States Patent and Trademark Office*